United States Patent
Gidon et al.

(10) Patent No.: US 7,567,497 B2
(45) Date of Patent: Jul. 28, 2009

(54) RECORDING SYSTEM COMPRISING A STORAGE LAYER AND AN ARRAY OF MICROTIPS

(75) Inventors: Serge Gidon, La Murette (FR); Olivier Lemonnier, La Terrasse (FR)

(73) Assignee: Commissariat a l'Energie Atomique, Paris (FR)

(*) Notice: Subject to any disclaimer, the term of this patent is extended or adjusted under 35 U.S.C. 154(b) by 515 days.

(21) Appl. No.: 11/547,908

(22) PCT Filed: Apr. 7, 2005

(86) PCT No.: PCT/FR2005/000847

§ 371 (c)(1),
(2), (4) Date: Oct. 10, 2006

(87) PCT Pub. No.: WO2005/102908

PCT Pub. Date: Nov. 3, 2005

(65) Prior Publication Data

US 2008/0037400 A1 Feb. 14, 2008

(30) Foreign Application Priority Data

Apr. 15, 2004 (FR) .................... 04 03921

(51) Int. Cl.
*G11B 9/00* (2006.01)
(52) U.S. Cl. .................... 369/126
(58) Field of Classification Search .......... 369/126; 365/151
See application file for complete search history.

(56) References Cited

U.S. PATENT DOCUMENTS

| 3,157,868 A | 11/1964 | Buslik |
| 5,015,850 A | 5/1991 | Zdeblick et al. |
| 5,206,665 A | 4/1993 | Kawade et al. |

(Continued)

FOREIGN PATENT DOCUMENTS

EP 1 148 370 A2 10/2001

(Continued)

OTHER PUBLICATIONS

Vettiger, et al. "The 'Millipede'—More than one thousand tips for future AFM data storage." *IBM J. Res. Develop.*, vol. 44, No. 3, pp. 323-340, May 2000.

*Primary Examiner*—Thang V Tran
(74) *Attorney, Agent, or Firm*—Oliff & Berridge, PLC

(57) ABSTRACT

The recording system consists of a recording medium (1) comprising a storage layer (2) which can store information. A data read and/or write device (4) comprises an array of microtips (5) disposed in a common plane facing the storage layer (2). The recording medium (1) comprises at least one first electrode (6). The read and/or write device (4) comprises at least one second electrode (7). The first electrode (6) is disposed facing the second electrode (7). The system comprises means (C) for controlling the distance (d) separating the recording medium (1) from the read and/or write device (4) by applying a potential difference (Vd) between the first (6) and second (7) electrodes. The read and/or write device (4) comprises contact elements (11) which are disposed between the read and/or write device (4) and the recording medium (1) and which co-operate with the storage layer (2) so as to cushion the contact between the microtips (5) and the storage layer (2).

9 Claims, 3 Drawing Sheets

U.S. PATENT DOCUMENTS

| | | | |
|---|---|---|---|
| 5,216,631 A | 6/1993 | Sliwa et al. | |
| 5,264,876 A | 11/1993 | Kawade et al. | |
| 5,371,728 A * | 12/1994 | Sakai et al. | 369/126 |
| 5,392,275 A * | 2/1995 | Kawada et al. | 369/126 |
| 5,396,066 A * | 3/1995 | Ikeda et al. | 369/126 |
| 5,396,453 A | 3/1995 | Kawada et al. | |
| 5,412,597 A | 5/1995 | Miyazaki et al. | |
| 5,418,771 A * | 5/1995 | Kasanuki et al. | 369/126 |
| 5,444,191 A * | 8/1995 | Yamamoto et al. | 369/126 |
| 5,554,851 A | 9/1996 | Hirai et al. | |
| 5,600,137 A | 2/1997 | Saito et al. | |
| 5,724,336 A | 3/1998 | Morton | |
| 5,886,922 A | 3/1999 | Saito et al. | |
| 6,262,962 B1 | 7/2001 | Aratani | |
| 6,269,067 B1 | 7/2001 | Aratani | |
| 6,272,083 B1 | 8/2001 | Aratani | |
| 6,304,527 B1 | 10/2001 | Ito et al. | |
| 6,411,589 B1 * | 6/2002 | Hoen et al. | 369/126 |
| 6,768,556 B1 | 7/2004 | Matsumoto et al. | |
| 2001/0010676 A1 | 8/2001 | Aratani | |
| 2001/0019532 A1 | 9/2001 | Aratani | |
| 2001/0021159 A1 | 9/2001 | Aratani | |
| 2001/0021166 A1 | 9/2001 | Aratani | |
| 2001/0043545 A1 | 11/2001 | Aratani | |
| 2004/0051161 A1 | 3/2004 | Tanaka et al. | |

FOREIGN PATENT DOCUMENTS

| | | |
|---|---|---|
| FR | 2 845 513 | 4/2004 |
| JP | A 06-139629 | 5/1994 |
| WO | WO 96/11472 | 4/1996 |

* cited by examiner

RECORDING SYSTEM COMPRISING A STORAGE LAYER AND AN ARRAY OF MICROTIPS

BACKGROUND OF THE INVENTION

The invention relates to a recording system consisting of a recording medium comprising a storage layer which can store data and a data read and/or write device comprising an array of microtips disposed in a common plane facing the storage layer, the recording medium comprising at least one first electrode and the read and/or write device comprising at least one second electrode, the first electrode being disposed facing the second electrode, the system comprising control means for controlling the distance separating the recording medium from the read and/or write device by applying a potential difference between the first and second electrodes.

STATE OF THE ART

In the field of ultra-high density data recording by microtips, the data is written and read by means of the microtips on storage areas of nanometric size, for example 20×20 nm². Generally speaking, an array of microtips is used in contact or quasi-contact with the surface of the medium to locally modify the properties thereof. The distance between two tips is for example about 100 micrometers. The contact forces must be very low, about one nano-Newton, in order not to damage the microtips or the surface of the medium, which is difficult to control. At the same time, relative mobility between the medium and the microtips has to be preserved. The system generally comprises an actuator for lateral relative movement of the medium with respect to the microtips, enabling the microtips to access the different storage areas. The Millipede® technique of the IBM corporation ("The Millipede—More than one thousand tips for future AFM data storage" by P. Vettiger et al. in IBM J. Res. Develop., Vol. 44, No. 3, May 2000) describes microtips disposed on a cantilever array whereby the microtips are made to press with a contact force that is a function of the cantilever flexion. This force then depends on the height of a microtip, including the cantilever, which can vary from one microtip to the other. The mean value of the contact force is a function of the distance between the cantilever array and the medium. In the event of a temperature drift, the force can not be adapted or controlled.

The document WO96/11472 describes a storage device comprising a storage medium formed at the surface thereof. In addition, the storage device comprises a probing device comprising a plurality of probes having conductive needles and probe drive circuits. The circuits are formed, by a monolithic semi-conductor type method, near the probes on the probing device. The probing device is divided into cells each comprising a needle and one of the drive circuits. The needles are disposed in a common plane facing the storage substrate. Each cell of the probing device can comprise auxiliary electrodes, for example having fins parallel to the substrate. The auxiliary electrodes are disposed facing the substrate. The substrate comprises an electrode formed on an opposite face to the face facing the probing device. An electrostatic attraction force is established between the auxiliary electrodes and the electrode formed on the substrate by means of the probe drive circuits. The probes are thereby controlled by applying a suitable voltage between the auxiliary electrodes and the substrate electrode. It is however difficult to implement an electrostatic repulsion between the electrodes.

OBJECT OF THE INVENTION

The object of the invention is to remedy these shortcomings and, in particular, to avoid damage to the microtips and/or the recording medium.

According to the invention, this object is achieved by the appended claims and, in particular, by the fact that the read and/or write device comprises contact elements disposed between the read and/or write device and the recording medium and co-operating with the storage layer so as to cushion the contact between the microtips and the storage layer.

BRIEF DESCRIPTION OF THE DRAWINGS

Other advantages and features will become more clearly apparent from the following description of particular embodiments of the invention given as non-restrictive examples only and represented in the accompanying drawings, in which.

DESCRIPTION OF PARTICULAR EMBODIMENTS

Figure 1:
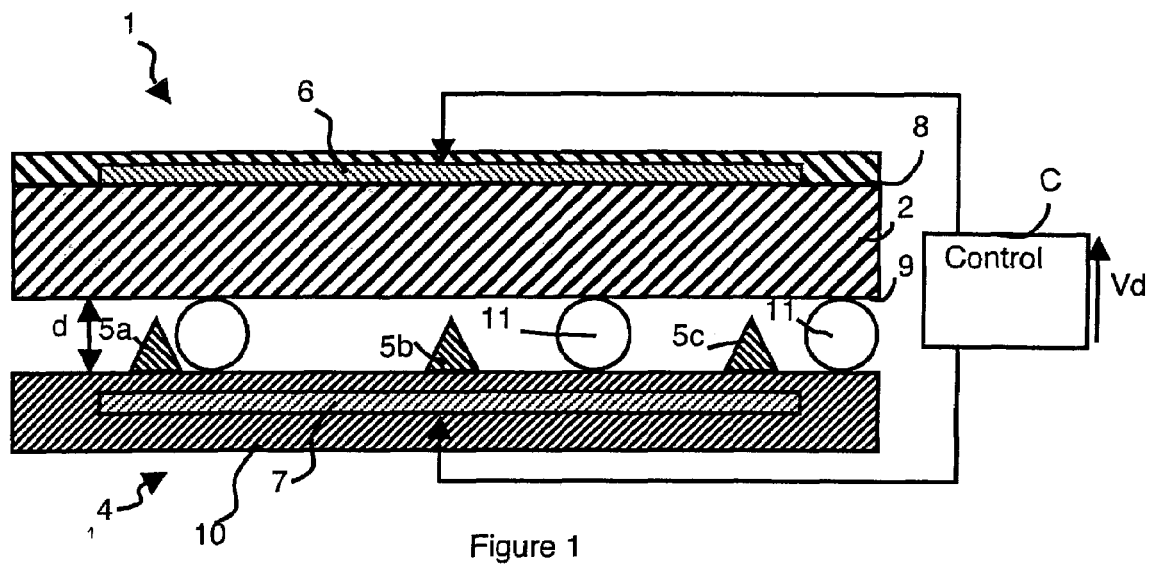
FIG. 1 represents a particular embodiment of a recording system according to the invention in cross-section.

In FIG. 1, a recording system comprises a recording medium 1 comprising a storage layer 2 which is able to store data. The storage layer 2 can be rigid or flexible and deformable. The recording system in addition comprises a data read and/or write device 4 comprising an array of microtips 5 (5a, 5b, 5c) disposed in a common plane facing the storage layer 2. The microtips 5 can be any sort of microtips, for example microtips comprising cantilevers, enabling data read and/or, by field effect, by thermal effect, etc. . . .

In FIG. 1, the recording medium 1 comprises a first electrode 6 and the read and/or write device 4 comprises a second electrode 7. The first electrode 6 is disposed facing the second electrode 7. The system comprises a control device C, for example a control circuit, for controlling the distance d separating the recording medium 1 from the read and/or write device 4 by applying a potential difference Vd between the first electrode 6 and second electrode 7.

In FIG. 1, the first electrode 6 is formed by a conductive layer disposed on a rear face 8 of the storage layer 2 opposite a front face 9 disposed facing the microtips 5. The second electrode 7 can also be formed by a conductive layer incorporated in a medium 10 of the array of microtips 5, possibly in such a way that the second electrode 7 is flush with the surface on which the microtips 5 are disposed.

Applying the potential difference Vd between the first electrode 6 and second electrode 7 creates a force between the recording medium 1 and the read and/or write device 4. The force per surface unit is about 50 nano-Newtons per 100 µm² for a potential difference Vd of 1V and for a typical distance of 100 nm between the microtips 5 and storage layer 2. The force can be increased by increasing the applied voltage.

Figure 2:
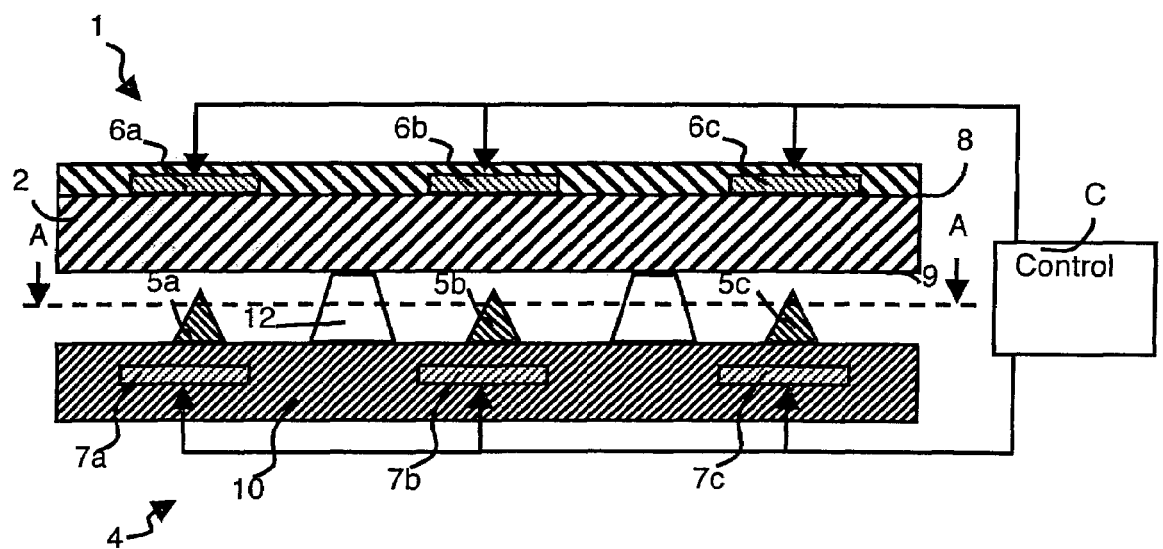
FIGS. 2 and 3 represent another particular embodiment of a recording system according to the invention, respectively in cross-section and along the line A-A.

As represented in FIG. 2, the recording medium 1 can comprise a plurality of first electrodes 6 (6a, 6b, 6c) formed by a plurality of conductive pads disposed on a rear face 8 of the storage layer 2 opposite the front face 9 disposed facing the microtips 5. In FIG. 2, the read and/or write device 4 comprises a plurality of second electrodes 7 formed by conductive pads buried in the medium 10 of the array of microtips 5. Thus the first electrodes 6 are respectively disposed facing the second electrodes 7. The system preferably comprises a single first electrode 6 and a plurality of second electrodes 7.

A mean contact force can be defined by a single value of the potential difference Vd by applying a first potential to all the first electrodes 6 and a second potential to all the second electrodes 7. The contact forces can also be controlled locally by applying specific potentials to the different electrodes 6 and 7, to control, for example, deformation of the storage layer 2 and to compensate a heightwise dispersion of the microtips 5 by deformation of the storage layer 2, in particular by servo-locking the potential differences to a measurement quantity representative of the distance between the microtips 5 and the storage layer 2, such as for example an electric current flowing through a microtip as described below. The distance between the microtips 5 and storage layer 2 can also be determined by detecting the temperature of the microtips in the write and read phases.

In the system according to the invention, the read and/or write device 4 comprises contact elements disposed between the read and/or write device 4 and the recording medium 1. The contact elements are preferably fixed onto the medium 10 of the array of microtips 5. The contact elements co-operate with the storage layer 2 so as to cushion the contact between the microtips 5 and the storage layer 2. This enables restoring forces to be introduced between the recording medium 1 and the read and/or write device 4 to move the storage layer 2 away from the microtips 5, whether it be in the rest phases of the system or when operating in read or write. The height of the contact elements (11, 12, 17, 18, 19; described hereinafter) is preferably comprised between 100 nanometers and 200 nanometers.

In a first particular embodiment, the read and/or write device 4 comprises contact elements made of flexible elastic material, i.e. deformable and able to revert to their initial shapes, designed to cushion the contact between the microtips 5 and storage layer 2. In this case, the recording medium 1 is rigid and presents, for example, a thickness of about 5 micrometers. The flexible elastic material can be an elastomer, for example Polydimethylsiloxane (PDMS), with a benzocyclobutene (BCB) or methacrylate base, or a flexible composite material comprising a rigid material and a deformable elastic material. For example, an element made of flexible elastic material can comprise a flexible layer surrounding a hard core or a hard layer covering a flexible core. The distance separating the microtips 5, in the plane of the microtips 5, is for example comprised between 10 micrometers and 100 micrometers, and deformation of the contact elements made of flexible elastic material in the direction of the applied force is about 10 nanometers.

As represented in FIG. 1, the elements made of flexible elastic material can for example be formed by micro-pellets 11 distributed randomly in the plane of the microtips. In FIG. 1, the micro-pellets 11 are disposed on the medium 10 of the array of microtips 5. The micro-pellets have a slightly larger diameter than the height of the microtips 5 and than the required distance between the storage layer 2 and the medium 10, for example a diameter of 150 nm for a distance of 100 nm between the storage layer 2 and medium 10. The micro-pellets 11 are distributed with a mean surface density such that, on average, several micro-pellets 11 are disposed around a microtip 5. The micro-pellets, which are for example latex pellets, can be disposed in a liquid solution which can be completely or partially evaporated.

Figure 3:
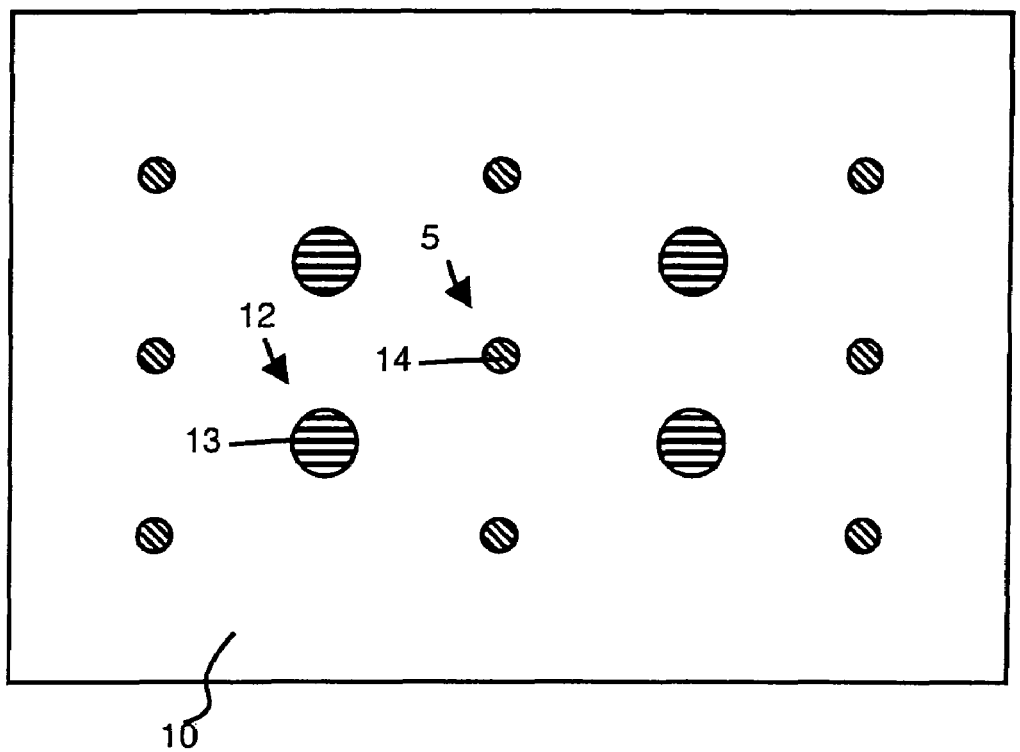

As represented in FIGS. 2 and 3, the elements made of flexible elastic material can, for example, be formed by pads 12 disposed in staggered manner with respect to the microtips 5, in the plane of the microtips 5. The pads 12 made of flexible elastic material are preferably in the form of a truncated cone the peak surface 13 whereof is substantially larger than the surface 14 of the microtips designed to come into contact with the storage layer 2. The pads 12 preferably have a height that is larger than the height of the microtips and can be electrically grounded. In order to be able to control the different heights when fabrication is performed, the pads 12 and microtips 5 are preferably achieved in the same fabrication step, for example by deposition of tungsten followed by planarization, for example mechanical-chemical polishing, and by an etching step delineating the microtips 5 and pads 12. As represented in FIG. 2, the pads 12 are broader than the microtips 5 and the microtips 5 are etched in such a way as to obtain a pointed conical shape which automatically reduces the height of the microtips 5 in controlled manner.

Figure 4:
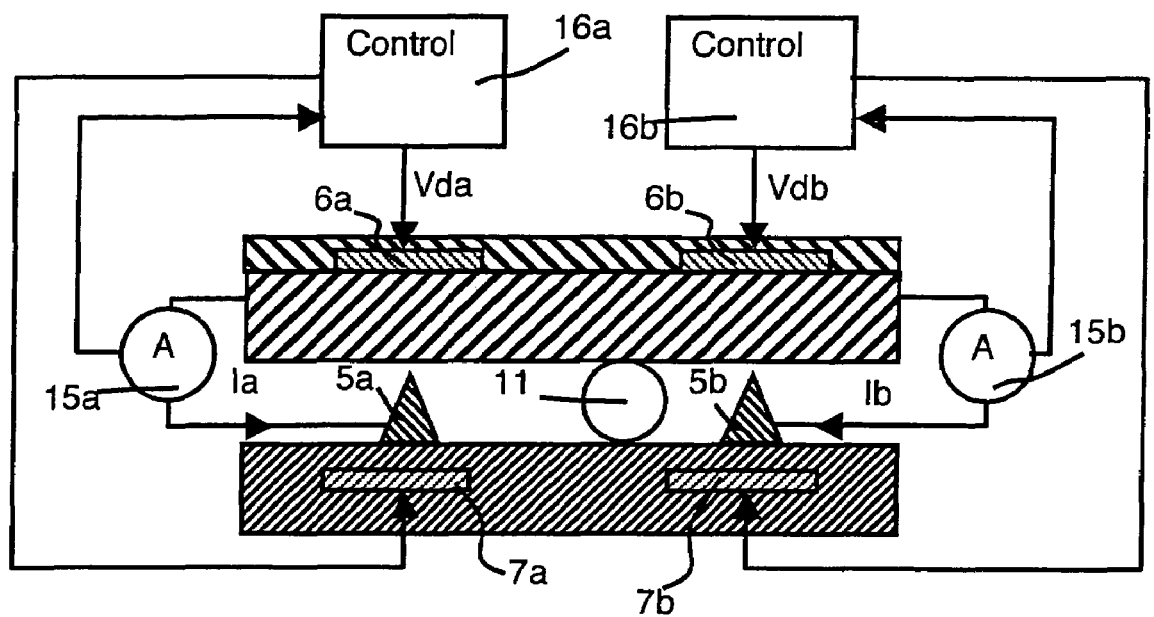
FIG. 4 illustrates a particular embodiment of a recording system according to the invention comprising selective control means by servo-control.

In the case where the storage layer 2 and the microtips 5 are conductive, the recording system can comprise detectors 15 (15a, 15b) measuring currents I (Ia and Ib) respectively flowing through the microtips 5a and 5b and the associated part of the storage layer 2, as represented in FIG. 4. By analogy with the operation of a scanning tunneling microscope (STM), the distance between a microtip 5 and the storage layer 2 can be controlled according to a measured tunnel current. The current flowing from a microtip 5 to the storage layer 2 depends greatly on the distance between the microtip 5 and the storage layer 2. A servo-control device 16a (16b) enables the potential difference Vda (Vdb) between the first 6a (6b) and second 7a (7b) electrodes to be controlled by servo-control on the current Ia (Ib). This enables contact to be avoided between the microtips and the storage layer 2, in the case of a very weak current 1, and thus prevents any wear of the microtips 5 and storage layer 2 in relative movement. In practice however, it may be more useful to use stronger currents, that are easier to control, at the cost of a very slight wear.

The servo-control device 16 can comprise a circuit, for example of proportional, integral and derivative (PID) type, which regulates the distance d on a sliding mean value, for example, to enable rapid variations of the current I to be detected, which variations may correspond to a binary state of a storage area in the case where the data is encoded by modulation of the local resistivity of the storage layer. The stiffness of the servo-control is associated with the flexibility of the storage layer 2, the amplitude of the restoring forces, the amplitude of the electrostatic force due to the potential difference Vd and the setting of the PID circuit. It constitutes a key point of operation of the system as the contact force of the microtips 5 on the storage layer 2 can be weak, about a few nano-Newtons, whereas the force required for deformation of the storage layer 2 can be much higher. The servo-control device 16 can comprise circuits associated with the microtips 5 and disposed respectively under the microtips 5.

In the particular embodiment represented in FIG. 4, the system comprises two second electrodes 7a and 7b, respectively associated with the first electrodes 6a and 6b. The servo-control devices 16 controlling the potential differences Vd are selective, i.e. they enable the potential differences Vda and Vdb to be controlled independently according to the currents Ia and Ib which are measured independently. For the sake of clarity, in FIG. 4 only two first electrodes 6 and two associated second electrodes 7 are represented. However, the system can comprise a plurality of second electrodes 7, respectively associated with a plurality of first electrodes 6 and with a plurality of servo-control devices 16. The number of microtips 5 is not necessarily identical to the number of first electrodes 6 and/or second electrodes 7. When the system comprises a single first electrode 6 and a single second electrode 7, the system can comprise a single servo-control device 16, enabling the potential difference Vd between the first electrode 6 and the second 7 electrode to be controlled by servo-locking on the currents I, measured by means of a plurality of detectors 15. Moreover, a second electrode 7 can be associated with several first electrodes 6 or vice-versa.

Figure 5:
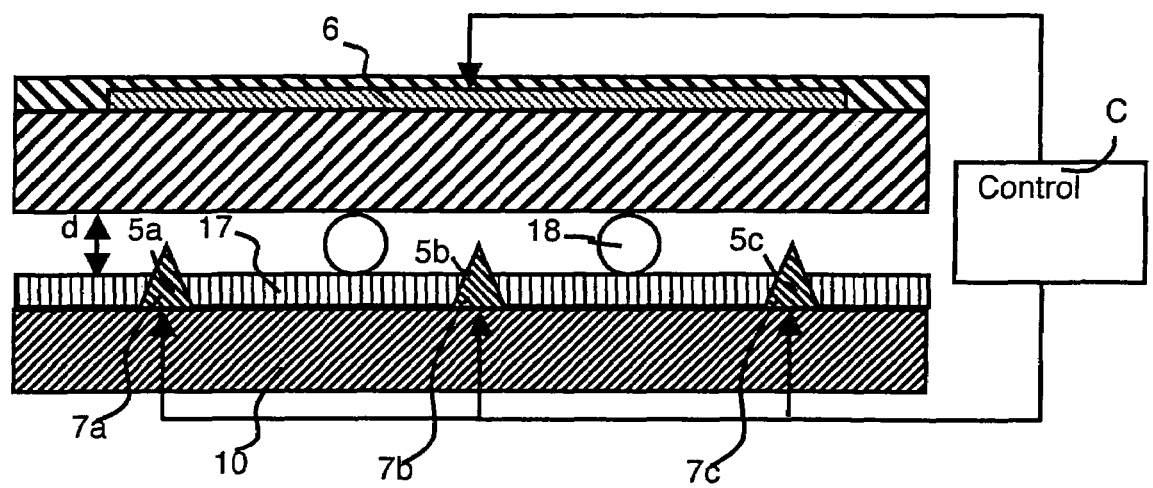
FIG. 5 represents a particular embodiment of a recording system according to the invention in cross-section.

In the embodiment represented in FIG. 5, the second electrodes 7 are formed by the microtips 5, which is for example an interesting solution when the write and/or read principle does not require a close contact between the storage layer and the microtips and/or when the storage layer 2 is made of non-conductive material, at the surface thereof. In FIG. 5, the elements made of flexible elastic material are formed by a layer 17 of flexible elastic material disposed around the microtips, in such a way that the microtips 5 are salient from the layer 17 of flexible elastic material. Second, hard or soft, micro-pellets 18 are disposed on the layer 17. Thus, the assembly formed by the second micro-pellets 18 and the layer 17 enables the contact between the microtips 5 and the storage layer 2 to be cushioned. The different sorts of elements made of flexible elastic material, for example the pads 12 and layer 17 made of flexible elastic material, can be combined, for example by structuring a layer of flexible elastic material so as to obtain a layer comprising salient elements.

Figure 6:
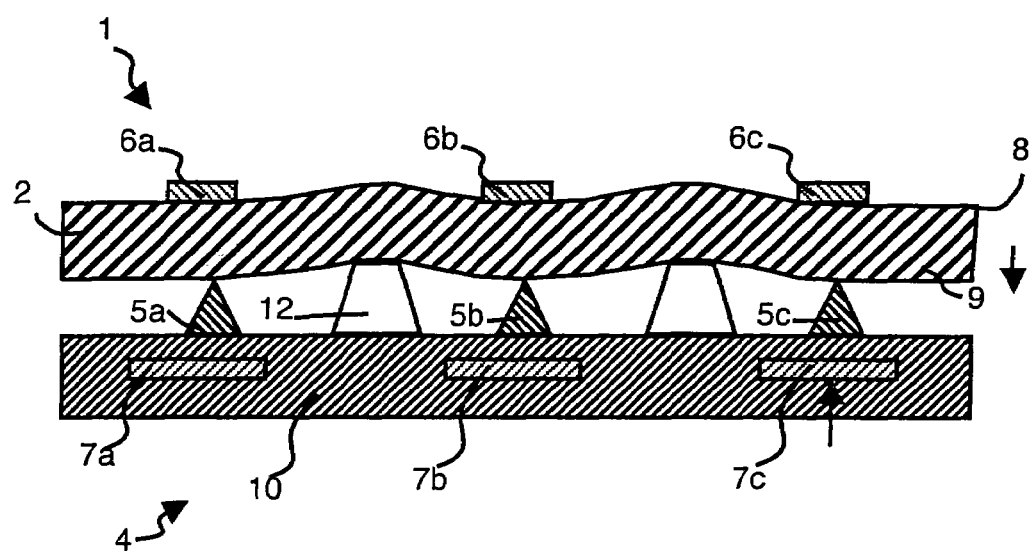
FIG. 6 represents a particular embodiment of another variant of a recording system according to the invention.

In a second particular embodiment of the invention, the contact elements of the read and/or write device 4 are formed by rigid elements 19 and the storage layer 2 is made of flexible elastic material. As represented in FIG. 6, the storage layer 2 is deformed under the pressure exerted by the rigid elements 19, which creates a repulsion between the storage layer 2 and the read and/or write device 4. As the storage layer co-operates essentially with the rigid elements 19, the contact between the microtips 5 and the storage layer 2 is cushioned. The recording medium 1 comprising the storage layer 2 is for example made of silicon and presents a thickness comprised between 0.3 micrometers and 1 micrometer, preferably 0.5 micrometers. In this case, the storage layer 2 can for example be fixed onto a frame. The rigid elements 19 are for example made of metal and preferably of tungsten W.

When the distance separating the microtips 5, in the plane of the microtips 5, is comprised between 10 micrometers and 100 micrometers, the deformation of the storage layer 2 in the direction of the applied force is about 10 nanometers. Advantageously, the dimensions of the surfaces of the electrodes 6 and 7 are 50×50 µm$^2$ and the applied voltage is comprised between 3 and 5V, which enables a suitable deformation of the storage layer 2 to be obtained. It is not always favorable to reduce the distance between the rigid elements 19 because this results in a too large increase of the stiffness force, i.e. the repulsive force. The distance between the rigid elements 19 or the distance between the microtips 5 is therefore preferably 100 micrometers.

The electrostatic force and the repulsive force must be close to one another. The electrostatic force can be calculated by the expression Fel=$\epsilon_0 V^2 S/e$, in which $\epsilon_0$ is the vacuum permittivity, V the voltage applied between the first and second electrodes, S the surface of the electrodes and e the distance between the electrodes. The repulsive force can be determined by the expression Fr=coeff.E.ep$^3$/D$^3$, where E is the Young's modulus of the storage layer material, ep the thickness of the storage layer 2 constituting the recording medium 1, D the distance between the rigid elements 19 and coeff a coefficient which can be determined experimentally.

The invention is not limited to the embodiments represented. In particular the first electrodes can be buried in the storage layer 2, disposed on the front face of the storage layer 2 or formed by the latter. The second electrodes can be buried in the medium 10 or be disposed on the front or rear face of the latter. The electrodes can be of any shape, for example round, square, rectangular, hexagonal or annular to be disposed around the microtips. The shape of the electrodes can be optimized to act as a shield for electrical fields created by addressing circuits and interacting with the storage layer 2. The electrodes can be achieved by any conventional method, for example by deposition and etching of a metal, for example copper, aluminium, tungsten or a tungsten nitride or oxide.

The invention claimed is:

1. Recording system comprising a recording medium comprising a storage layer which can store data and a data read and/or write device comprising:
    an array of microtips disposed in a common plane facing the storage layer,
    the recording medium comprising at least one first electrode and the read and/or write device comprising at least one second electrode,
    the first electrode being disposed facing the second electrode,
    the system comprising control means for controlling a distance separating the recording medium from the read and/or write device by applying a potential difference between the first electrode and the second electrode, and
    the system characterized in that the read and/or write device comprises rigid contact elements disposed between the read and/or write device and the recording medium and co-operating with the storage layer so as to cushion the contact between the microtips and the storage layer, the storage layer being made of a flexible elastic material.

2. The system according to claim 1, wherein the recording medium comprising the storage layer is made of silicon and presents a thickness of less than 1 micrometer.

3. The system according to claim 1, wherein the first electrode is formed by a conductive layer disposed on a rear face of the storage layer opposite a front face disposed facing the microtips.

4. The system according to claim 1, comprising a plurality of second electrodes formed by conductive pads incorporated in a medium of the array of microtips.

5. The system according claim 1, comprising a plurality of first electrodes formed by conductive pads disposed on a rear face of the storage layer opposite a front face disposed facing the microtips.

6. The system according to claim 1, comprising means for detecting measurement quantities representative of the distances between the microtips and the storage layer and servo-control means by servo-locking of the potential difference between the first electrode and the second electrode to the measurement quantities.

7. The system according to claim 6, wherein, the system comprising a plurality of second electrodes, associated with at least one first electrode, the control means by servo-locking of the potential difference between the first electrode and the second electrode are selective.

8. The system according to claim 6, wherein the measurement quantities are currents respectively flowing through the microtips.

9. The system according to claim 1, wherein the second electrodes are formed by the microtips.

* * * * *